United States Patent
Tsao et al.

(10) Patent No.: US 7,122,471 B2
(45) Date of Patent: Oct. 17, 2006

(54) METHOD FOR PREVENTING VOIDS IN METAL INTERCONNECTS

(75) Inventors: Jung-Chih Tsao, Taipei (TW); Chi-Wen Liu, Hsinchu (TW); Si-Kua Cheng, Hsinchu (TW); Che-Tsao Wang, Taipei (TW); Steven Lin, Hsin-Chu (TW); Hsien-Ping Feng, Yonghe (TW); Chen-Peng Fan, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 122 days.

(21) Appl. No.: 10/835,315

(22) Filed: Apr. 28, 2004

(65) Prior Publication Data

US 2005/0245064 A1     Nov. 3, 2005

(51) Int. Cl.
*H01L 21/44* (2006.01)
*H01L 21/42* (2006.01)
*H01L 21/268* (2006.01)
*H01L 21/428* (2006.01)

(52) U.S. Cl. ............... 438/660; 438/663; 438/795; 438/E21.347; 438/E21.475; 438/675; 438/672

(58) Field of Classification Search ............... 438/660, 438/663, 672, 675, 795; 257/E21.347, E21.475
See application file for complete search history.

(56) References Cited

U.S. PATENT DOCUMENTS

| | | | | |
|---|---|---|---|---|
| 5,932,289 | A | * | 8/1999 | Dobson et al. ............ 427/585 |
| 6,124,205 | A | * | 9/2000 | Doan ........................ 438/688 |
| 6,863,491 | B1 | * | 3/2005 | Cheng et al. ............ 414/744.5 |
| 2003/0168346 | A1 | * | 9/2003 | Hey et al. .................. 205/157 |

* cited by examiner

*Primary Examiner*—Luan Thai
(74) *Attorney, Agent, or Firm*—Tung & Associates

(57) ABSTRACT

A novel method for preventing the formation of voids in metal interconnects fabricated on a wafer, particularly during a thermal anneal process, is disclosed. The method includes fabricating metal interconnects between metal lines on a wafer. During a thermal anneal process carried out to reduce electrical resistance of the interconnects, the wafer is positioned in spaced-apart relationship to a wafer heater. This spacing configuration facilitates enhanced stability and uniformity in heating of the wafer by reducing the presence of particles on and providing a uniform flow of heated air or gas against and the wafer backside. This eliminates or at least substantially reduces the formation of voids in the interconnects during the anneal process.

20 Claims, 4 Drawing Sheets

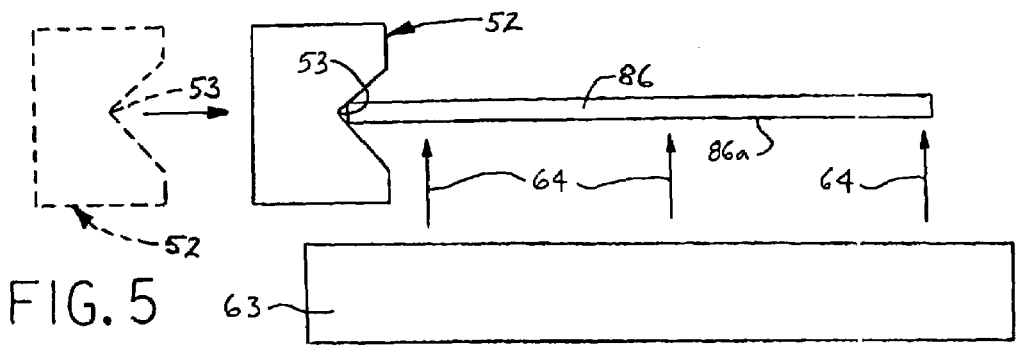
FIG.5
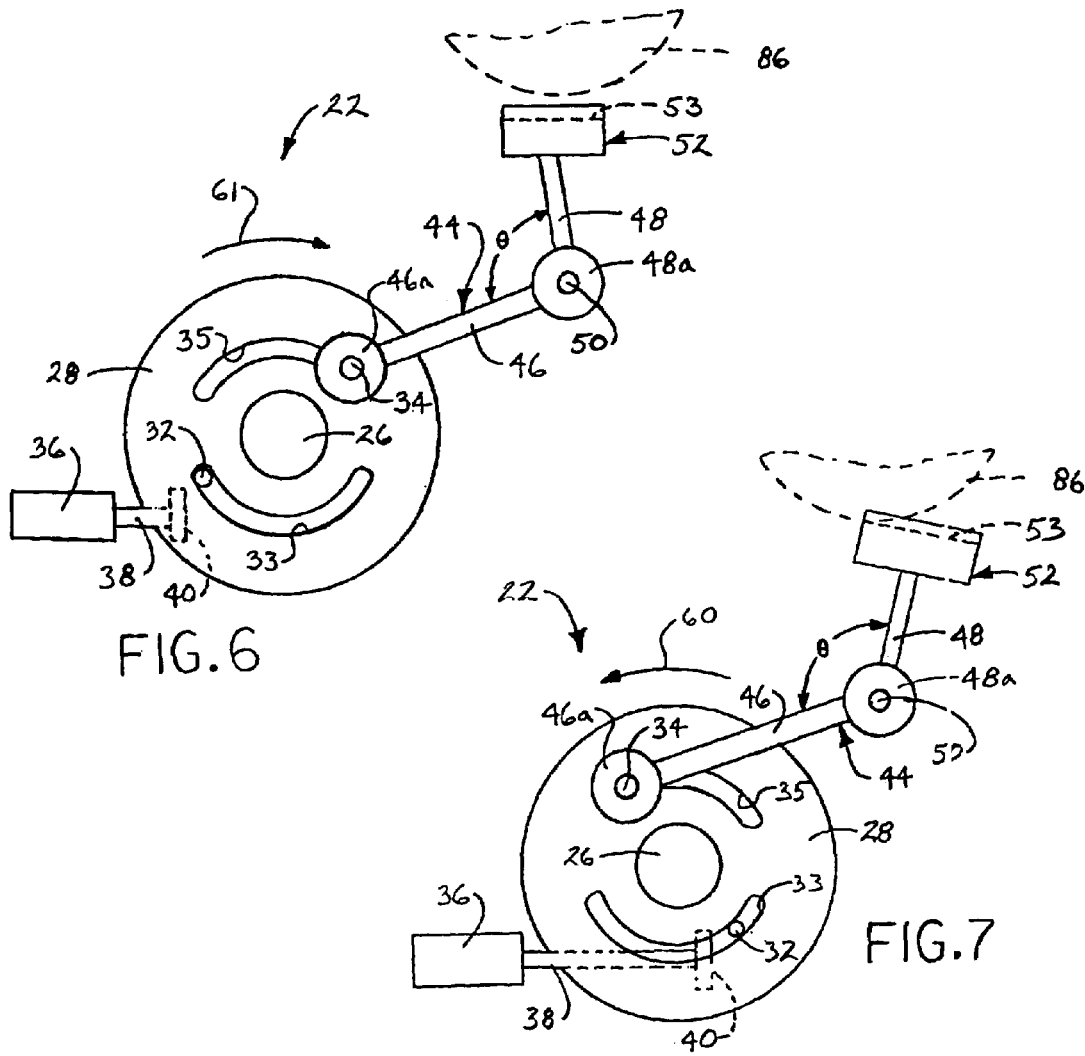
FIG.6
FIG.7

METHOD FOR PREVENTING VOIDS IN METAL INTERCONNECTS

FIELD OF THE INVENTION

The present invention relates to methods of annealing metal interconnects in integrated circuit devices fabricated on semiconductor wafers. More particularly, the present invention relates to a method of preventing the formation of voids in metal interconnects such as vias on a wafer by facilitating wafer temperature control during an anneal process.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulating layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner. The various layers define circuit components or devices such as transistors.

After the individual devices have been fabricated on the substrate, they must be connected together to perform the desired circuit functions. This interconnection process is generally known as "metallization" and is performed using a number of different photolithographic, deposition, and removal techniques. In a common interconnection process, two interconnect channels of conductor materials are separated by interlayer dielectric layers in vertically separated planes perpendicular to each other and interconnected by a vertical connection, or "via", at their closest point.

A conventional device structure 65 is shown in FIG. 1. In fabrication of the device structure 65, via openings 74 are typically formed by initial deposition of a silicon dioxide intermetal dielectric (IMD) layer 68 of desired thickness which corresponds to the thickness for the via openings 74 to be etched in the IMD layer 68. The IMD layer 68 covers metal lines 67 fabricated in or on a wafer 66. Photolithography and dry etching are used to pattern and etch the via openings 74 in the IMD layer 68.

Next, a barrier layer 70 of Ta or TaN is deposited on the sidewalls and bottoms of the via openings 74. A uniform copper seed layer 71 is then deposited on the barrier layer 74 using CVD. After the trenches and vias are filled with a copper via plug 69 in a single copper inlay step, the copper overburden extending from the via openings 74 is removed and the upper surfaces of the metal lines planarized using CMP. An additional metal line 73 is formed on the IMD layer 68, in electrical contact with each via plug 69.

After formation of the via plugs 69, the device structure 65 is typically subjected to a thermal anneal step which is carried out in an RTP (rapid thermal processing) chamber (not shown). As shown in FIG. 2, in the RTP chamber the wafer 66 is placed on a wafer heater 75, with the heating surface of the wafer heater 75 disposed in direct physical and thermal contact with the backside of the wafer 66. The anneal step reduces the electrical resistance of the via plugs 69 in the device structure 65.

In the thermal anneal step, the wafer 66 is directly heated by the wafer heater 75. After initial placement of the wafer 66 on the wafer heater 75, the wafer heater 75 is gradually heated to a target temperature. Frequently, however, the actual processing temperature overshoots the target temperature for the wafer 66. Furthermore, the presence of particles (not shown) which remain on the wafer heater 75 upon placement of the wafer 66 thereon adversely affect the heating performance of the wafer heater 75. Moreover, the wafer-heating characteristics vary among different RTP chambers in a processing sequence, resulting in different results among multiple wafers in a lot or between lots.

As further shown in FIG. 1, voids 72 are a common structural anomaly which occurs in the via plug 69 as a result of imprecise or unstable heating of the wafer 66 during the thermal anneal process. These voids 72 partially or completely break electrical communication between the lower-level metal lines 67 and upper-level metal lines 73 in the device structure 65. Accordingly, a method is needed for preventing the formation of voids in via plugs, particularly during a thermal anneal process carried out to reduce the electrical resistance of the via plugs in a device structure.

An object of the present invention is to provide a novel method for preventing the formation of voids in via plugs.

Another object of the present invention is to provide a novel method for preventing the formation of voids in via plugs by providing uniform and stable heating of a wafer during a thermal anneal process.

Still another object of the present invention is to provide a novel void formation prevention method in which uniform and stable heating of a wafer during a thermal anneal process is carried out by providing a wafer heater and spacing the wafer from the wafer heater.

Yet another object of the present invention is to provide a novel void formation prevention method in which a wafer is spaced from a wafer heater to facilitate uniform and stable heating of the wafer during a thermal anneal process by providing multiple spacer pins on the wafer heater and supporting the wafer on the spacer pins, above the heater during the thermal anneal process.

A still further object of the present invention is to provide a novel void formation prevention method in which a wafer is spaced from a wafer heater to facilitate uniform and stable heating of the wafer during a thermal anneal process by providing at least one gripper block, causing engagement of the gripper block with the wafer and supporting the wafer above the wafer heater during the thermal anneal process.

SUMMARY OF THE INVENTION

In accordance with these and other objects and advantages, the present invention is generally directed to a novel method for preventing the formation of voids in metal interconnects fabricated on a wafer, particularly during a thermal anneal process. The method includes fabricating metal interconnects, particularly electrically-conductive via plugs, between metal lines on a wafer. During a thermal anneal process carried out to reduce electrical resistance of the interconnects, the wafer is positioned in spaced-apart relationship to a wafer heater. This spacing configuration facilitates enhanced stability and uniformity in heating of the wafer by reducing the presence of particles on and providing a uniform flow of heated air or gas against the wafer backside. This prevents the formation of voids in the interconnects during the anneal process.

In one embodiment of the invention, multiple thermally-insulating spacer pins are provided in upward-standing relationship on the wafer heater. The wafer is supported on the spacer pins throughout the anneal process. In another embodiment, multiple gripper blocks are provided for gripping the edge of the wafer and supporting the wafer above the wafer heater during the anneal process.

BRIEF DESCRIPTION OF THE DRAWINGS

The invention will now be described, by way of example, with reference to the accompanying drawings, in which:

FIG. 5 is a schematic view of a wafer, illustrating gripping of the wafer by a gripper block and supporting of the wafer above a wafer heater using the gripper block, according to one embodiment of the method of the present invention;

FIG. 6 is a top view of a wafer support unit provided with a gripper block, with the gripper block shown in a disengaged position with respect to a wafer according to one embodiment of the method of the present invention;

FIG. 7 is a top view of a wafer support unit provided with a gripper block, with the gripper block engaging a wafer according to one embodiment of the method of the present invention;

DETAILED DESCRIPTION OF THE INVENTION

The present invention contemplates a novel method for preventing the formation of voids in metal interconnects, particularly copper via plugs, fabricated on a wafer during a thermal anneal process carried out to reduce electrical resistance of the via plugs. The method includes fabricating the electrically-conductive via plugs between metal lines on a wafer. A thermal anneal process is then carried out to reduce electrical resistance of the via plugs. During the thermal anneal process, the wafer is positioned in spaced-apart relationship to a wafer heater provided in a thermal anneal chamber. Spacing of the wafer with respect to the wafer heater reduces or eliminates the presence of particles on the wafer backside, as well as provides a uniform flow of heated air or gas against the wafer, during anneal. Consequently, heating and annealing of the wafer is carried out in a uniform and stable manner, thereby eliminating or at least reducing the formation of voids in the via plugs during the anneal process.

In one embodiment according to the method of the invention, multiple thermally-insulating spacer pins extend upwardly from the surface of the wafer heater. Throughout the anneal process, the wafer is supported on the spacer pins. In another embodiment, multiple gripper blocks grip the edge of the wafer and support the wafer above the wafer heater during the anneal process.

Figure 10:
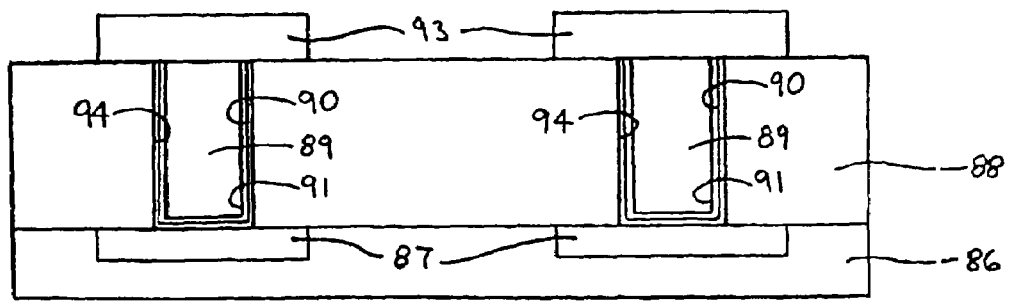
FIG. 10 is a cross-sectional view of a device structure having a pair of via plugs subjected to a thermal anneal step according to the method of the present invention.

Referring initially to FIG. 10, a device structure 85 which includes via plug interconnects 89 subjected to an anneal process according to the method of the present invention, is shown. The device structure 85 includes a pair of lower-level metal lines 87, typically tantalum (Ta) or copper (Cu), which are fabricated in or on a semiconductor wafer 86. An intermetal dielectric (IMD) layer 88, which may be silicon dioxide, for example, is deposited on the wafer 86 and covers the lower-level metal lines 87. Via openings 94 are patterned and etched in the IMD layer 88. This is followed by deposition of a barrier layer 90 in each via opening 94 and a seed layer 91, typically copper, on the barrier layer 90.

A via plug 89, which is typically copper, is deposited in each via opening 94, on the seed layer 91. Finally, upper-level metal lines 93 are fabricated on the IMD layer 88, in electrical contact with the respective via plugs 89. Accordingly, the via plugs 89 establish electrical communication between the lower-level metal lines 87 and the upper-level metal lines 93 in the device structure 85. The metal lines 87, via openings 94, barrier layer 90, seed layer 91, via plugs 89 and metal lines 93 may be fabricated using conventional etching, photolithography and deposition techniques known by those skilled in the art. According to the method of the present invention, after fabrication of the via plugs 89 or upper-level metal lines 93, the device structure 85 is subjected to a thermal anneal process to reduce the electrical resistance of the via plugs 89 in the finished device structure 85.

Figure 1:
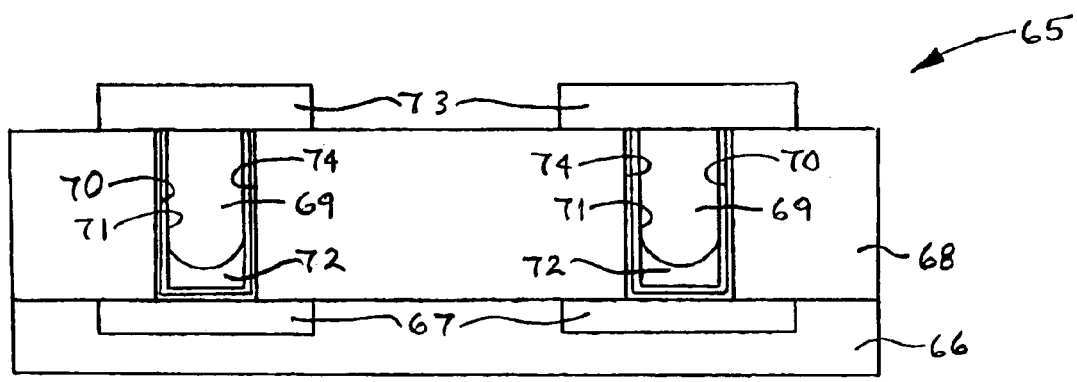
FIG. 1 is a cross-sectional view of a device structure having a pair of via plug interconnects fabricated on a wafer, illustrating the formation of voids in the via plugs during a conventional thermal anneal step of interconnect fabrication.
Figure 2:
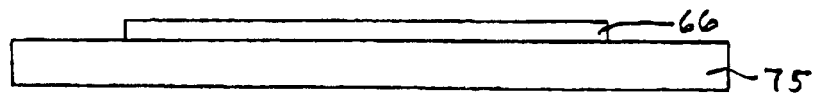
FIG. 2 is a schematic view of a wafer provided in direct physical and thermal contact with a wafer heater during a conventional thermal anneal step in the annealing of via plugs on a wafer.
Figure 3:
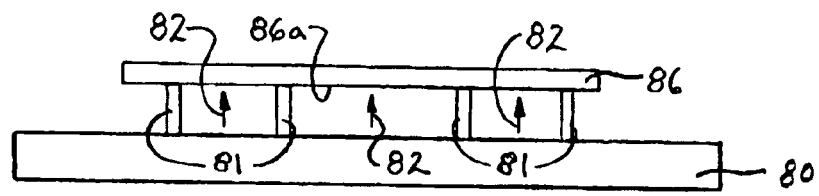
FIG. 3 is a schematic view of a wafer heater, with multiple spacer pins extending from the wafer heater and a wafer supported on the spacer pins during a thermal anneal process carried out according to the method of the present invention.
Figure 4:
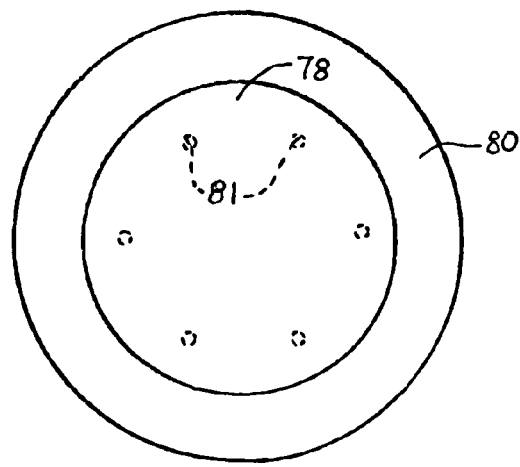
FIG. 4 is a top view of a wafer supported on multiple spacer pins (shown in phantom) according to the configuration of FIG. 3.

Referring next to FIGS. 3 and 4, in one embodiment according to the method of the present invention, multiple spacer pins 81 are provided in upward-standing relationship to each other on a wafer heater 80. The wafer heater 80 is provided inside a conventional anneal chamber, such as an ELECTRA (trademark) anneal chamber available from Applied Materials, for example. Each of the spacer pins 81 is a thermally-insulating material such as ceramic, for example. As shown in FIG. 4, the spacer pins 81 extend upwardly from the wafer heater 80 in spaced-apart relationship to each other to facilitate stable support of the wafer 86 above the wafer heater 80.

Prior to the anneal process, the wafer 86, having the via plugs 89 (FIG. 10) fabricated thereon, is placed on the upward-standing spacer pins 81 in the anneal chamber (not shown). This step is typically performed using an automated wafer transfer robot (not shown), as is known by those skilled in the art. Next, heated gas 82, such as helium, for example, is released from openings (not shown) provided in the upper surface of the wafer heater 80, typically in conventional fashion. In a uniform dispersement, the heated gas 82 contacts the backside 86a of the wafer 86. This enables a slow ramp-up of the wafer 86 to the target temperature and stable maintenance of the wafer 86 at the target temperature, and prevents overheating of the wafer 86. Furthermore, since the backside 86a of the wafer 86 remains in spaced-apart relationship to the upper gas-emitting surface of the wafer heater 80, particulate contaminants (not shown) on the wafer heater 80 are incapable of adhering to the wafer backside 86a and interfering with uniform heating of the wafer 86. This results in the annealing of via plugs 89 substantially without voids in the device structure 85, thereby increasing the yield and performance of the device structure 85 in the finished electronic product.

Figure 8:
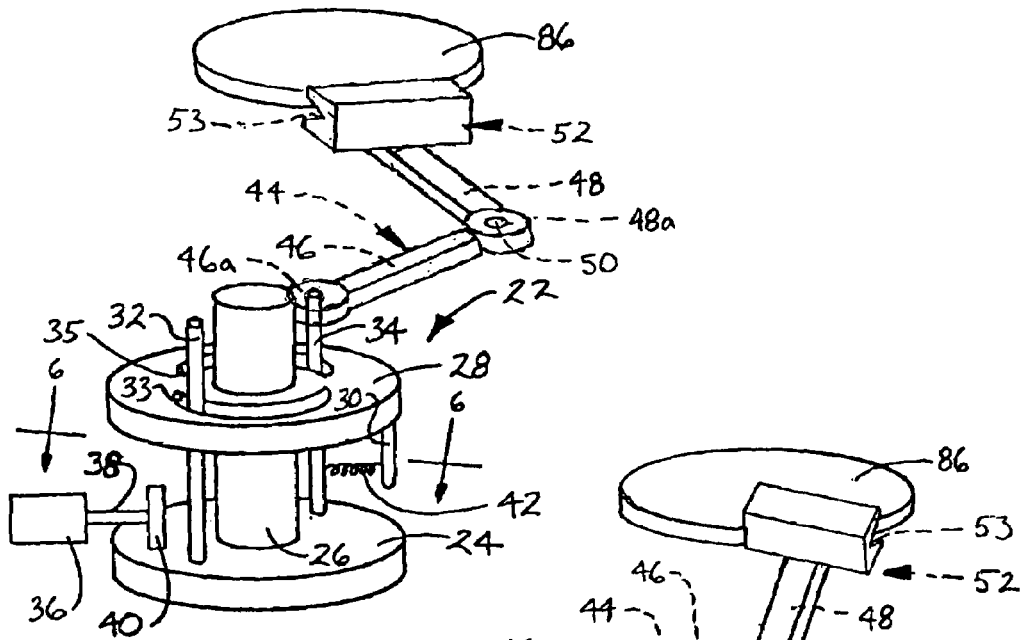
FIG. 8 is a perspective view of a wafer support unit, with the gripper block of the wafer support unit in a disengaged position with respect to a wafer.
Figure 9:
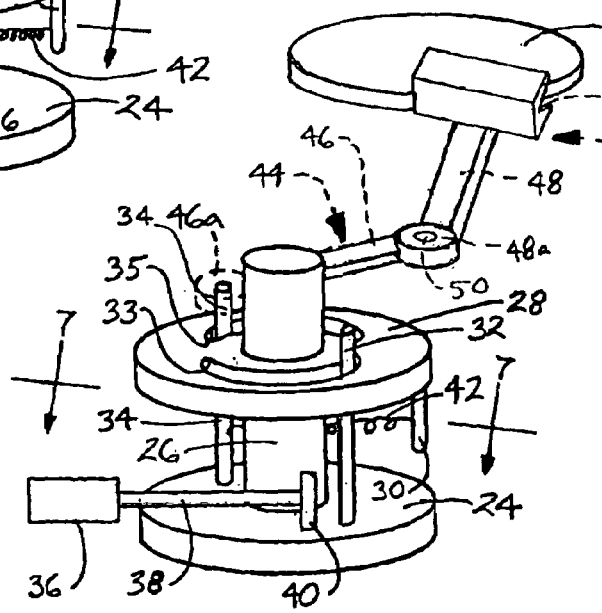
FIG. 9 is a perspective view of a wafer support unit, with the gripper block of the wafer support unit engaging a wafer.
Figure 11:
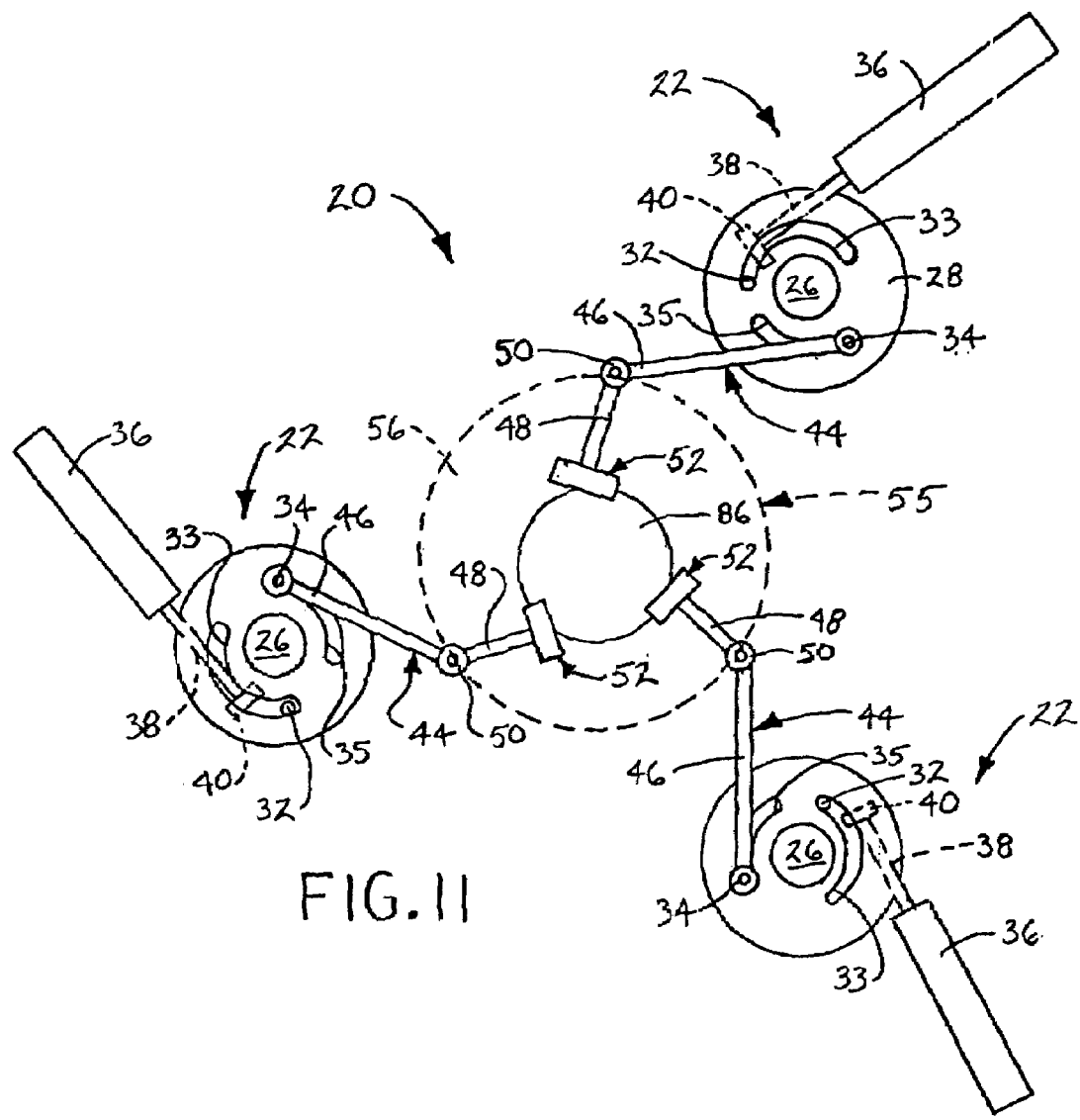
FIG. 11 is a top view of multiple wafer support units, with a corresponding number of gripper blocks gripping an edge of a wafer in one embodiment of the method of the present invention.

Referring next to FIGS. 5–9 and 11, according to another embodiment of the method of the present invention, the wafer 86 is supported above a wafer heater 63 (FIG. 5) by means of gripper blocks 52. As shown in FIG. 11, a wafer support 20 typically includes at least three wafer support units 22 which are collectively adapted for supporting the wafer 86 in a conventional anneal chamber 55, such as an ELECTRA (trademark) anneal chamber available from Applied Materials, for example. However, it is understood that the invention may include four or more of the wafer support units 22. The wafer support units 22 are spaced around the anneal chamber 55 in such a manner as to engage or grip respective edge portions of the wafer 86 and securely support the wafer 86 in the chamber 55 during processing, as hereinafter described. As shown in FIGS. 8 and 9, each of the wafer support units 22 may be similar in construction and includes a base 24 which is rotatably mounted on a shaft 26. A piston 38 is selectively extendible from an actuating cylinder 36, which may be air-actuated or fluid-actuated, and the extending end of the piston 38 is terminated by a piston attachment flange 40 that engages the base 24.

A stabilizing shaft 32 and an arm mount shaft 34 extend upwardly from the base 24, typically in substantially diametrically-opposed relationship to each other. A fixed plate 28 is mounted on the shaft 26, above the base 24. A generally arcuate stabilizing shaft slot 33 and a generally arcuate arm mount shaft slot 35 extend through the fixed plate 28 and receive the upwardly-extending stabilizing shaft 32 and arm mount shaft 34, respectively. A spring mount rod 30 extends downwardly from the bottom surface of the fixed plate 28, in spaced-apart relationship to the arm mount shaft 34. A coiled tensioning spring 42 connects the spring mount rod 30 to the arm mount shaft 34 for purposes which will be hereinafter described.

As shown in FIGS. 6–9, a gripper arm 44 is mounted on the arm mount shaft 34. The gripper arm 44 is typically disposed beneath the bottom (not shown) of the chamber 55 and may be characterized by a toggle-linkage that includes a proximal arm segment 46, having an arm collar 46a which is attached to the arm mount shaft 34 in non-rotatable relationship thereto. A distal arm segment 48 includes an arm collar 48a which is pivotally attached to the proxmial arm segment 46. A gripper block flange (not shown) extends upwardly from the distal end portion of the distal arm segment 48 and slidably traverses a slot (not shown) that extends through the bottom 56 of the anneal chamber 55.

A gripper block 52, which may have an elongated, generally rectangular shape, is mounted on the gripper block flange (not shown), above the chamber bottom 56. The gripper block 52 is constructed of a thermally-insulating material, such as ceramic, for example, and includes a longitudinal wafer groove 53.

In typical operation of the wafer support 20, the multiple wafer support units 22 are typically operated in concert with each other to simultaneously engage and support the wafer 86 above a wafer heater 63 (FIG. 5) in the anneal chamber 55 for anneal processing and disengage the wafer 58 during subsequent removal of the wafer 58 from the anneal chamber 55 after processing, as follows. Accordingly, although the multiple wafer support units 22 operate in conjunction with each other, each of the wafer support units 22 is operated in the following manner. As shown in FIG. 6, when the piston 38 is retracted into the actuating cylinder 36, the gripper arm 44 is positioned in such a manner that the distal arm segment 48 is disposed at an acute angle "θ" with respect to the proxmial arm segment 46 and the gripper block 52 is disengaged from the wafer 86. At that time, the wafer 86 is held in place in the chamber 55 typically by a wafer transfer robot (not shown), in conventional fashion. As the piston 38 is extended from the actuating cylinder 36, as shown in FIG. 7, the base 24 is rotated typically in the counterclockwise direction, as indicated by the arrow 60, such that the arm mount shaft 34 traverses the arcuate arm mount shaft slot 35. Simultaneously, and in like manner, the stabilizing shaft 32 traverses the stabilizing shaft slot 33 and facilitates smooth movement of the arm mount shaft 34 in the arm mount shaft slot 35. Furthermore, the tensioning spring 42, normally in the flaccid configuration of FIG. 8 and biasing the gripper arm 44 and gripper block 52 in the wafer-disengaging position, is tensioned or stretched between the moving arm mount shaft 34 and the stationary spring mount rod 30, as shown in FIG. 9. Consequently, as shown in FIG. 7, the distal arm segment 48 pivots with respect to the proximal arm segment 46, at the pivot pin 50, until the distal arm segment 48 is disposed at an obtuse angle "θ" with respect to the proximal arm segment 46 and the wafer groove 53 in the gripper block 52 receives the edge of the wafer 86, as shown in FIGS. 5, 7 and 9. At that point, the wafer transfer robot (not shown) releases the wafer 86, which is securely supported by the gripper blocks 52 of the respective wafer support units 22, as shown in FIG. 11.

During the anneal process, a heated gas 64, such as helium, for example, is emitted from the wafer heater 63, typically in conventional fashion. In a uniform dispersement, the heated gas 64 contacts the backside 86a of the wafer 86, enabling a slow ramp-up of the wafer 86 to the target temperature and stable maintenance of the wafer 86 at the target temperature, and preventing overheating of the wafer 86. Since the backside 86a of the wafer 86 remains in spaced-apart relationship to the upper gas-emitting surface of the wafer heater 63, particulate contaminants (not shown) on the wafer heater 63 are incapable of adhering to the wafer backside 86a and interfering with uniform heating of the wafer 86. This results in the annealing of via plugs 89 (FIG. 10) substantially without voids in the device structure 85, thereby increasing the yield and performance of the device structure 85 in the finished electronic product.

After completion of the anneal process, the wafer transfer robot (not shown) again engages the wafer 86, after which the piston 38 of the wafer support unit 22 is retracted into the actuating cylinder 36. This action, imparted by the retracting piston 38 under assistance by the contracting tensioning spring 42, facilitates typically clockwise rotation of the base 24, as indicated by the arrow 61 in FIG. 6, in such a manner that the stabilizing shaft 32 and the arm mount shaft 34 traverse the respective stabilizing shaft slot 33 and arm mount shaft slot 35, the distal arm segment 48 pivots with respect to the proximal arm segment 46 to define the acute angle "θ" shown in FIG. 6, and the gripper block 52 disengages the edge or bevel of the wafer 86. Finally, the wafer transfer robot removes the wafer 86 from the anneal chamber 55, typically in conventional fashion.

While the preferred embodiments of the invention have been described above, it will be recognized and understood that various modifications can be made in the invention and the appended claims are intended to cover all such modifications which may fall within the spirit and scope of the invention.

What is claimed is:

1. A method of preventing formation of voids in interconnects on a wafer, comprising:
   providing a wafer;
   providing metal filled interconnects on said wafer;
   providing a wafer heater; and
   annealing said interconnects by positioning a backside of said wafer in spaced-apart relationship to said wafer heater during operation of said wafer heater while providing a heated gas directed at said water backside.

2. The method of claim 1 wherein said positioning said wafer in spaced-apart relationship to said water heater comprises providing a plurality of spacer pins in upward-standing position on said wafer heater and supporting said wafer on said plurality of spacer pins.

3. The method of claim 1 wherein each of said interconnects comprises copper.

4. The method of claim 3 wherein said positioning said wafer in spaced-apart relationship to said water heater comprises providing a plurality of spacer pins in upward-standing position on said water heater and supporting said wafer on said plurality of spacer pins.

5. The method of claim 1 wherein said positioning said wafer in spaced-apart relationship to said wafer heater comprises providing a plurality of gripper blocks, causing engagement of said plurality of gripper blocks with said wafer and supporting said wafer over said wafer heater.

6. The method of claim 5 wherein each of said interconnects comprises copper.

7. The method of claim 5 further comprising a plurality of wafer support units and wherein said plurality of gripper blocks is carried by said plurality of wafer support units, respectively, and operable to engage and disengage said water by operation of said plurality of wafer support units, respectively.

8. The method of claim 7 wherein each of said interconnects comprises copper.

9. A method of preventing formation of voids in via plugs on a wafer, comprising:
   providing a wafer;
   providing an intermetal dielectric layer on said wafer;
   providing via plugs in said interinetal dielectric layer;
   providing a wafer heater; and
   annealing said via plugs by positioning a backside of said wafer in spacedapart relationship to said wafer heater during operation of said wafer heater while providing a heated gas directed at said wafer backside.

10. The method of claim 9 wherein said positioning said wafer in spaced-apart relationship to said wafer heater comprises providing a plurality of thermally-insulatihg spacer pins in upward-standing position on said wafer heater and supporting said wafer on said plurality of spacer pins.

11. The method of claim 9 wherein each of said via plugs comprises copper.

12. The method of claim 11 wherein said positioning said wafer in spacedapart relationship to said water heater comprises providing a plurality of thermally-insulating spacer pins in upward-standing position on said wafer heater and supporting said wafer on said plurality of spacer pins.

13. The method of claim 9 wherein said positioning said wafer in spacedapart relationship to said wafer heater comprises providing a plurality of thermally-insulating gripper blocks each having an elongated wafer groove; causing insertion of said wafer into said wafer groove of said plurality of gripper blocks, respectively; and supporting said wafer over said wafer heater.

14. The method of claim 13 wherein each of said via plugs comprises copper.

15. The method of claim 13 further comprising a plurality of wafer support units and wherein said plurality of gripper blocks are carried by said plurality of wafer support units, respectively, and operable to engage and disengage said wafer by operation of said plurality of wafer support units, respectively.

16. The method of claim 15 wherein each of said via plugs comprises copper.

17. A method of preventing formation of voids in via plugs on a wafer, comprising:
   providing a wafer;
   providing an intermetal dielectric layer on said wafer;
   providing via plugs in said intermetal dielectric layer;
   providing a wafer heater; and
   annealing said via plugs by positioning a backside of said wafer in spaced-apart relationship to said wafer heater and emitting a heated gas from said wafer heater against said wafer backside.

18. The method of claim 17 wherein said positioning said wafer in spaced-apart relationship to said wafer heater comprises providing a plurality of thermally-insulating spacer pins in upward-standing position on said wafer heater and supporting said wafer on said plurality of spacer pins.

19. The method of claim 17 wherein said positioning said water in spaced-apart relationship to said wafer heater comprises providing a plurality of thermally-insulating gripper blocks each having an elongated wafer groove; causing insertion of said wafer into said wafer groove of said plurality of gripper blocks, respectively; and supporting said wafer over said wafer heater.

20. The method of claim 19 further comprising a plurality of wafer support units and wherein said plurality of gripper blocks are carried by said plurality of wafer support units, respectively, and operable to engage and disengage said wafer by operation of said plurality of wafer support units, respectively.

* * * * *